United States Patent
McNulty et al.

(10) Patent No.: US 7,572,425 B2
(45) Date of Patent: Aug. 11, 2009

(54) SYSTEM AND METHOD FOR PRODUCING SOLAR GRADE SILICON

(75) Inventors: Thomas Francis McNulty, Ballston Lake, NY (US); Bruce Gordon Norman, Charlton, NY (US); Mark Philip D'Evelyn, Niskayuna, NY (US); Roman Shuba, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 171 days.

(21) Appl. No.: 11/855,233

(22) Filed: Sep. 14, 2007

(65) Prior Publication Data

US 2009/0074647 A1 Mar. 19, 2009

(51) Int. Cl.
*C01B 33/02* (2006.01)
*C01B 33/021* (2006.01)
*C01B 33/023* (2006.01)
*C01B 33/025* (2006.01)

(52) U.S. Cl. .................. 423/348; 423/349; 423/350

(58) Field of Classification Search .......... 423/348, 423/349, 350
See application file for complete search history.

(56) References Cited

U.S. PATENT DOCUMENTS

| 4,188,368 | A |  | 2/1980 | Wolf et al. |
| 4,612,179 | A |  | 9/1986 | Sanjurjo et al. |
| 4,981,668 | A | * | 1/1991 | Dosaj et al. .................. 423/350 |
| 5,244,646 | A | * | 9/1993 | Stanley ........................ 423/350 |
| 5,324,494 | A | * | 6/1994 | Glatzmaier ................. 423/345 |
| 6,231,826 | B1 |  | 5/2001 | Hanazawa et al. |
| 2006/0086310 | A1 |  | 4/2006 | Egeberg |

FOREIGN PATENT DOCUMENTS

WO 2005061383 A1 7/2005

* cited by examiner

*Primary Examiner*—Timothy C Vanoy
*Assistant Examiner*—Serena L Hanor
(74) *Attorney, Agent, or Firm*—Ann M. Agosti

(57) ABSTRACT

A starting material including silica and carbon is heated to form an intermediate material. The intermediate material includes silica and silicon carbide. The intermediate material is reacted to form silicon. At least some of the emissions that are generated by heating the starting material and reacting the intermediate material are collected and used to generate electric power.

17 Claims, 4 Drawing Sheets

SYSTEM AND METHOD FOR PRODUCING SOLAR GRADE SILICON

BACKGROUND

The invention relates generally to production of solar grade silicon, and more particularly to a system and method for recovering and utilizing wasted energy during silicon production.

A large demand exists for high purity silicon material for production of semiconductor devices and solar cells. Silicon is used in solar cells for conversion of solar energy into electrical energy. Silicon employed in solar cells is of a quality designated as "solar grade" which has a purity of greater than 99.999 percent.

Most silicon production methods involve the carbothermic reduction of silicon dioxide, or silica. Carbothermic reduction involves a process in which mixtures of carbon and silica react at high temperature to form elemental silicon and carbon monoxide. This process is an energy-intensive process due to the extreme temperature requirements to drive the reaction to completion. For example, the temperature may be greater than 1950 degrees Celsius in such a process. This corresponds to roughly eleven to thirteen kilowatt-hours of energy to produce one kilogram of silicon.

Accordingly, it is desirable to provide a system and method that may address one or more of the foregoing problems in the production of solar grade silicon.

BRIEF DESCRIPTION

In accordance with one exemplary embodiment disclosed herein, a method includes heating a starting material including silica and carbon to form an intermediate material. The intermediate material includes silica and silicon carbide. The intermediate material is reacted to form silicon. At least some of the emissions that are generated by heating the starting material and reacting the intermediate material are collected and used to generate electric power.

In accordance with another exemplary embodiment disclosed herein, a system includes a furnace having a first furnace zone configured to produce a starting material comprising silica and carbon. A second furnace zone is configured to receive the starting material and to heat the starting material to form an intermediate material including silica and silicon carbide. A third furnace zone is configured to receive the intermediate material and to react the intermediate material to form silicon. A power generation system is coupled to the furnace and configured to receive hydrogen, carbon monoxide, or combinations thereof vented from the furnace for generating electric power.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the present invention provide a method including providing a starting material. In one example, the starting material is produced inside a first furnace zone and includes silica and carbon. The starting material is then heated in a second furnace zone to form an intermediate material. The intermediate material includes silica and silicon carbide. The intermediate material is reacted in a third furnace zone to form solar grade silicon. At least some of the emissions generated by heating the starting material and reacting the intermediate material are collected and used to generate electric power. In another exemplary embodiment, a system for producing solar grade silicon integrated with a waste energy recovery system is also disclosed.

The growth of the silicon-based solar energy industry is, to a certain extent, limited by the cost of solar grade silicon. The cost of the solar grade silicon is attributable to the cost of the raw materials used for the manufacture as well as to the cost involved in the processing. Typical raw materials for silicon production include a siliceous source and a carbon source. Methods that employ less expensive raw materials typically require more expensive processing conditions to purify the resultant silicon. Embodiments of the present invention address these and other issues.

According to exemplary embodiments of the present invention, when producing silicon, syngas (carbon monoxide and hydrogen) is generated as a result of carbothermic reduction of silica using hydrocarbon or carbon material, and this syngas comprises a combustible fuel that is fed to a power generation system and converted to electric power. In one exemplary embodiment, the power generation system includes a internal combustion engine-driven generator, hereafter referred to as "ICE generator". The electric power is fed to a furnace used for producing the silicon. The recovery of waste energy enables a reduction in the overall energy usage of the furnace during production of silicon.

In U.S. patent application Ser. No. 11/497876, incorporated herein by reference, a process is disclosed where the carbon material in the carbothermic reduction process is obtained from methane or another hydrocarbon. The principal byproduct of the initial hydrocarbon cracking process is hydrogen.

When mixed with the carbon monoxide from the carbothermic reaction, the resultant exhaust stream may consist of approximately 70% carbon monoxide and 30% hydrogen (molar basis). This effluent, known as synthetic gas (syngas), is similar in composition to gas generated in coal gasification processes. It is a combustible fuel with energy that can be recovered and returned to the process, thus lowering the energy requirements.

Figure 1:
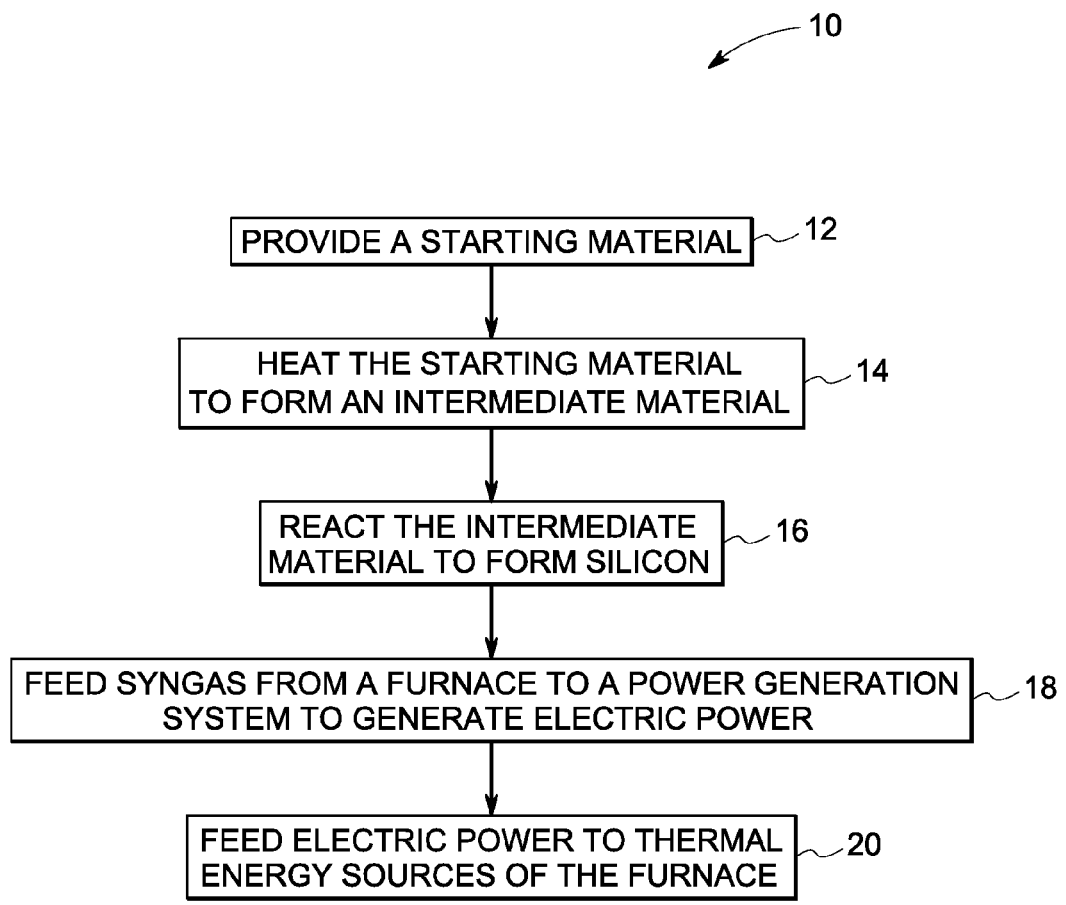
FIG. 1 is a flow chart illustrating the exemplary steps involved in a method of producing silicon in accordance with an exemplary embodiment disclosed herein.

Referring now to the figures, FIG. 1 is a flow chart 10 illustrating exemplary steps involved in the method of producing silicon. The method includes providing a starting material comprising silica and carbon within a furnace as represented by the step 12. In one embodiment, the silica of the starting material includes silica sand having a plurality of granules. As used herein, the term "granules" refers to individual units of starting material, in contrast to, for example, a solid continuum of material such as a large block; the term as used herein encompasses units ranging from infinitesimal powder particulates with sizes on the micrometer scale (such as, for example, a 325 mesh powder) up to comparatively large pellets of material with sizes on the centimeter scale. In another exemplary embodiment, the silica of the starting material includes a silica gel, which is granular, porous form of silica. Silica gel may be described more specifically as a coherent, rigid, continuous 3-dimensional network of spherical particles of colloidal silica.

In certain exemplary embodiments, the step of providing the starting material includes decomposing a hydrocarbon material on least a portion of the silica material. The decomposition of hydrocarbon material is also referred to as "cracking of the hydrocarbon material," wherein the hydrocarbon material decomposes to form a coating comprising carbon on at least a portion of the silica material. The hydrocarbon material may include a gas or a liquid. An example of one such decomposition reaction may be represented by the chemical equation:

$$CH_4 \rightarrow C + 2H_2.$$

In the foregoing example, methane is used as a hydrocarbon material and decomposes to form carbon, which is deposited on at least a portion of the silica material with an accompanying release of hydrogen gas. When the coating comprising carbon is deposited on granules comprising silica, a surface area of carbon available for further reaction with silica is considerably higher than that available in conventional processes that do not employ this coating, and this may lead to a better yield of solar grade silicon.

In certain exemplary embodiments, decomposing the hydrocarbon material includes heating the hydrocarbon material to a temperature greater than 600 degrees Celsius. In some embodiments, the hydrocarbon material includes alkanes, alkenes, alkynes, aromatic hydrocarbons, or any combinations thereof. Examples of hydrocarbon material include, but are not limited to, natural gas, methane, butane, propane, acetylene, or any combinations thereof. At step 14, the starting material is heated to form an intermediate material including silica and silicon carbide. In some embodiments, the intermediate material includes at least one material selected from a group including synthetic silica, silicon carbide, silicon oxycarbide, or combinations thereof. In certain exemplary embodiments, the starting material is heated to a temperature greater than 1600 degrees Celsius. The reaction including formation of the intermediate material is represented by the following equation:

$$3SiO_2 + 6C \rightarrow SiO_2 + 2SiC + 4CO.$$

In the foregoing reaction, silica reacts with carbon to form silicon carbide and silica, along with an accompanying release of carbon monoxide gas. In certain embodiments, the partial pressure of carbon monoxide is maintained less than 50 Kilo Pascal. In some embodiments, the total pressure within the furnace may be greater than or equal to 100 Kilo Pascal. At step 16, the intermediate material is reacted such as by heating to a temperature greater than 2000 degrees Celsius to form silicon. Silica is reacted with silicon carbide to form silicon. The reaction including the formation of solar grade silicon is represented by the following equation:

$$SiO_2 + 2SiC \rightarrow 3Si + 2CO.$$

In the illustrated embodiment, at least some of the emissions that are generated by heating the starting material and reacting the intermediate material are collected. At step 18, the emissions, i.e. syngas (including hydrogen, carbon monoxide), are fed from the furnace to a power generation system, for example an ICE generator, to generate electric power. In some embodiments, the hydrogen and carbon monoxide are fed simultaneously from the furnace to the power generation system. In certain other exemplary embodiments, the hydrogen and carbon monoxide are fed separately from the furnace to the power generation system. Also, in certain embodiments, hydrogen and carbon monoxide are compressed and stored temporarily in a storage unit before being fed to the power generation system. At step 20, the electric power is fed to the furnace. As a result, the recovery of waste energy from the furnace facilitates reduction in overall energy usage of the furnace during production of silicon. Power may be supplied from an external grid to the furnace to supplement the power requirement. In certain cases power may be supplied from the power generation system to the grid. In some embodiments, at least a portion of the syngas and/or of the combustion product gas is used to pre-heat at least some of the starting material (not shown in FIG. 1), making further use of waste energy. For example, the exhaust gases from the power generation may be passed through a heat exchanger 47 to pre-heat the silica and/or the hydrocarbon gas.

Figure 2:
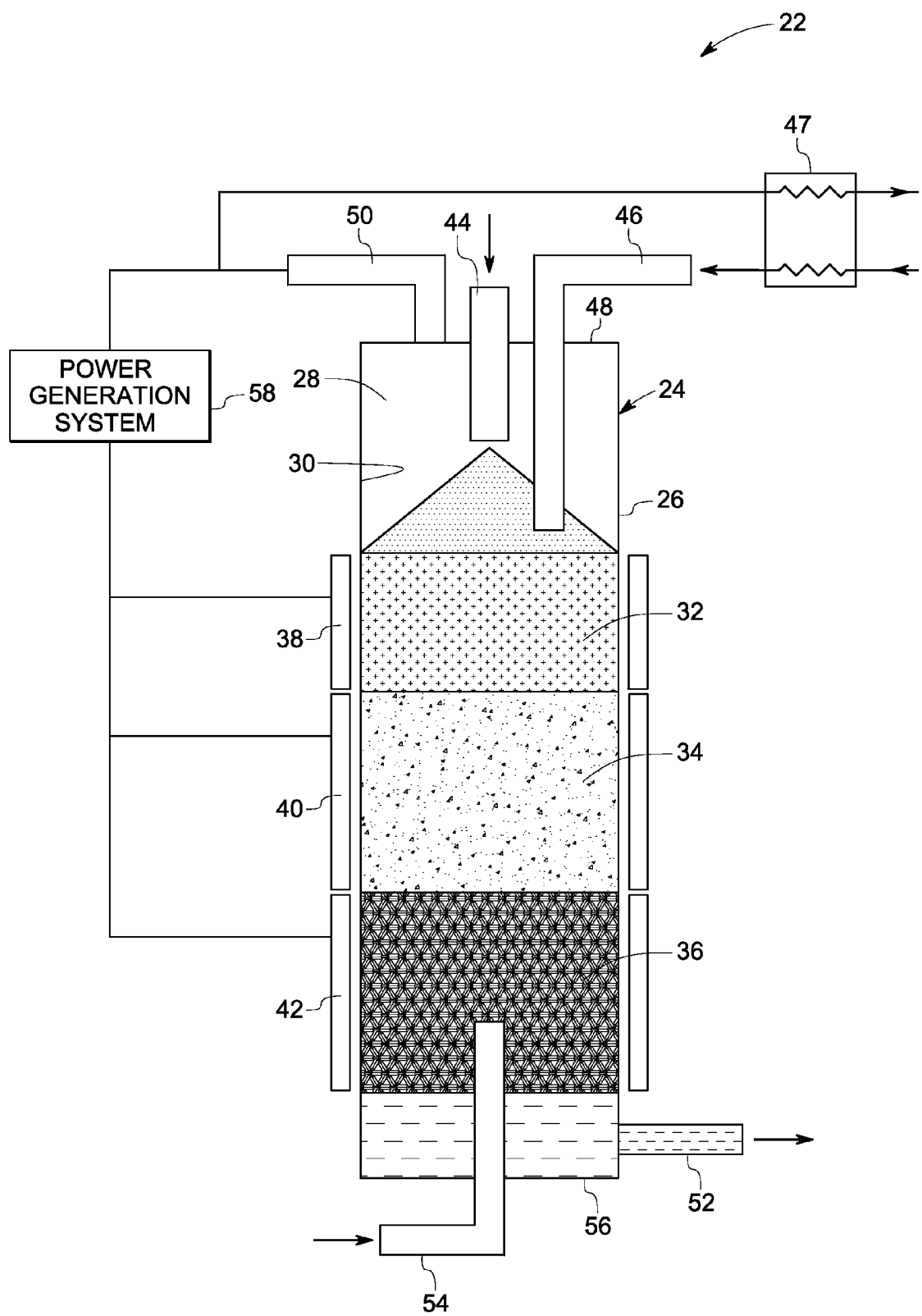
FIG. 2 is a diagrammatical representation of a system used for producing silicon in accordance with an exemplary embodiment disclosed herein.

Referring to FIG. 2, a system 22 for the production of solar grade silicon in accordance with an exemplary embodiment of the present invention is illustrated. The system 22 is a furnace provided to accept a starting material including silica and a carbon-containing material at one end of the furnace and produce a product material including silicon at an opposite end of the furnace. In the illustrated embodiment, the system 22 includes a multi-zone furnace in which temperature of each furnace zone is independently controllable. The system 22 includes a housing 24 having a wall 26 that defines a chamber 28. In some embodiments, a removable liner (not shown) may be provided along an inner surface 30 of the wall 26 to avoid contamination and also to prevent material deposition on the inner surface of the wall 26.

In the illustrated embodiment, the housing 24 of the system 22 is cylindrically shaped. The housing 24 has a vertically oriented configuration. In other embodiments, other shapes and orientations of the housing are also envisaged. For example, the housing may be horizontal or tilted with respect to horizontal. The chamber 28 of the system 22 is further divided into a first furnace zone 32 (coating furnace zone), a second furnace zone 34 (heating furnace zone), and a third furnace zone (reaction furnace zone) 36 based on the reaction occurring in these zones. The first, second, and third furnace zones 32, 34, 36 are typically but not necessarily integrated. As used herein, "integrated" means that zones 32, 34, and 36 together form a single unit. First, second, and third thermal energy sources 38, 40, 42 (e.g. heaters) are provided proximate to the zones 32, 34, 36 respectively and configured to be capable of heating the zones 32, 34, 36 to different temperatures.

A silica inlet 44 and a hydrocarbon inlet 46 extend through an upper end 48 of the housing 24 into the chamber 28 and are configured to introduce silica and hydrocarbon material into the chamber 28. The flow rate of the hydrocarbon material into the chamber 28 may be adjusted for an extensive, uniform formation of the carbon coating on the starting material. A gas outlet 50 is provided extending through an upper end 48 of the housing 24 in communication with the chamber 28. A silicon outlet 52, and a gas inlet 54 extend through a lower end 56 of the housing 24 and are in communication with the chamber 28 through the third furnace zone 36.

The silica inlet 44 is configured to introduce silica material into the chamber 28. The first thermal energy source 38 is activated to raise the temperature at the first furnace zone 32 to a predetermined level. In certain exemplary embodiments, the first furnace zone temperature is greater than 600 degrees Celsius. The hydrocarbon material is decomposed to form a coating on at least a portion of the silica material with an accompanying release of hydrogen gas. The second furnace zone 34 receives the starting material including silica and carbon. The temperature of the starting material is increased at the second furnace zone 34 by activating the thermal energy source 40. In some embodiments, the temperature of the second furnace zone is greater than 1600 degrees Celsius. The silica and carbon react to form an intermediate material including silica and silicon carbide in the second furnace zone 34 with an accompanying release of carbon monoxide gas. The third furnace zone 36 receives the intermediate material. The temperature at the third furnace zone 36 is increased by activating the third thermal energy source 42. In some embodiments, the temperature of the third furnace zone is greater than 2000 degrees Celsius. Silica is reacted with silicon carbide to form solar grade silicon with an accompanying release of carbon monoxide. Silicon is extracted through the silicon outlet 52. It should be noted herein that the position of inlets 44, 46, and 54 and outlets 50, 52 may be varied, depending on the application requirements.

In the illustrated embodiment, emissions such as hydrogen and carbon monoxide generated by providing the starting material, heating the starting material and reacting the intermediate material, are fed simultaneously from the furnace to a power generation system 58. The power generation system 58 has a combustor, or burner (not shown), in which the syngas (including hydrogen and carbon monoxide) is combined with high-pressure air and burned. The resulting high temperature exhaust gas is expanded via a power turbine (not shown) to generate electric power. The generated electric power is fed to one or more of the first, second, and third thermal energy sources 38, 40, and 42. This recovery of waste energy from the furnace reduces the overall energy usage of the system during the production of silicon. The carbothermic reduction of silicon is an energy-intensive process, typically requiring eleven to thirteen kilowatt-hours of energy to produce one kilogram of silicon. By recovering the waste energy from the exhaust gases, the overall energy usage of the system 22 decreases substantially. Additionally, greenhouse gas emissions are reduced.

Figure 3:
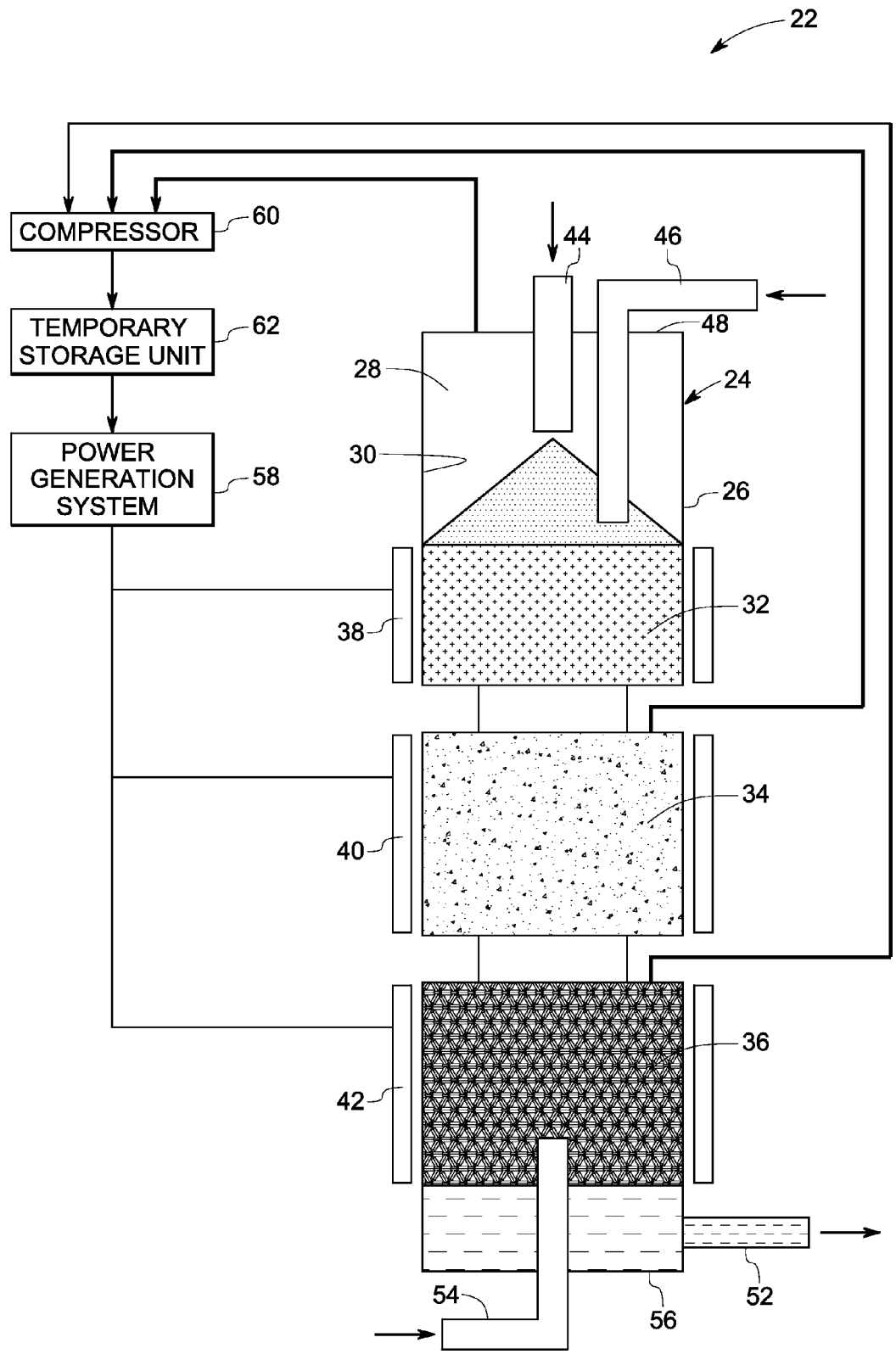
FIG. 3 is a diagrammatical representation of a system used for producing silicon in accordance with yet another exemplary embodiment disclosed herein.

Referring to FIG. 3, a system 22 for the production of solar grade silicon in accordance with another exemplary embodiment is illustrated. In the illustrated embodiment, the system 22 includes a multi-zone furnace in which temperature of each furnace zone is independently controllable. The system 22 is further divided into a first furnace zone 32, a second furnace zone 34, and a third furnace zone 36 based on the reaction occurring in these zones. In the illustrated embodiment, the first, second, and third furnace zones 32, 34, 36 are not integrated i.e. the zones 32, 34, 36 are provided separately. In other words, the zones 32, 34, 36 are provided as separate units. It should be noted herein that any number of combinations of integrated and separate furnace zones are envisaged. The illustrated zones 32, 34, 36 have a vertical orientation. First, second, and third thermal energy sources 38, 40, 42 are provided proximate to the zones 32, 34, 36 respectively and configured to heat the zones 32, 34, 36 to different temperatures. The syngas including hydrogen and carbon monoxide generated by heating the starting material and reacting the intermediate material in the furnace are fed to the power generation system 58 via a compressor 60 and at least one temporary storage unit 62. In the illustrated embodiment, hydrogen and carbon monoxide are fed separately from the decoupled zones 32, 34, and 36 to a compressor 60 where the exhaust gases are compressed and then stored temporarily in a temporary storage unit 62. In another embodiment, separate storage units may be provided for storing hydrogen and carbon monoxide. The exhaust gases are then burnt and expanded via the power generation system 58 to generate electric power. In some embodiments, only hydrogen is fed to the power generation system. In some other embodiments, combination of hydrogen and carbon monoxide is fed to the power generation system 58. The electric power is then fed to one or more of the thermal energy sources 38, 40, and 42.

Figure 4:
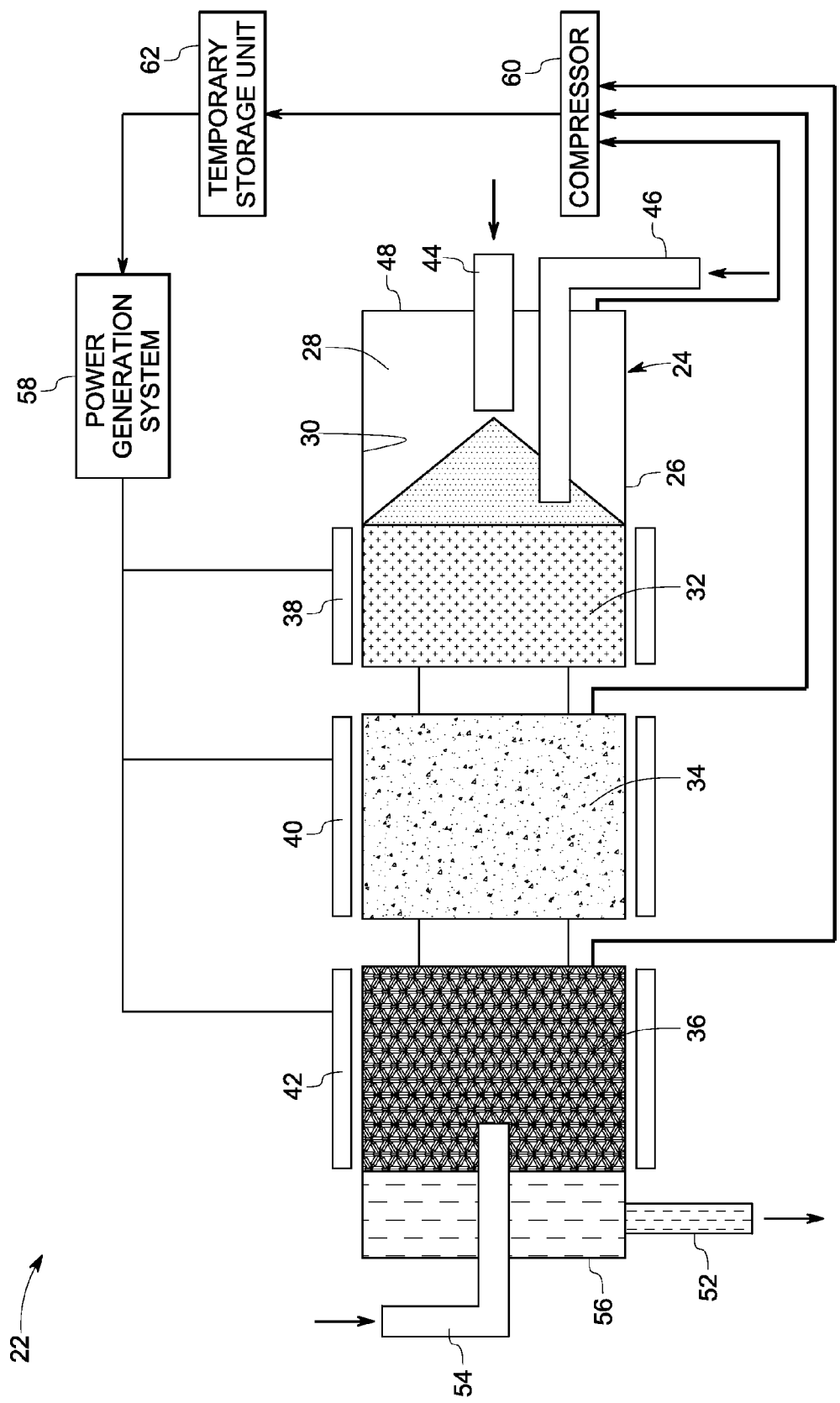
FIG. 4 is a diagrammatical representation of a system used for producing silicon in accordance with yet another exemplary embodiment disclosed herein.

Referring to FIG. 4, a system 22 for the production of solar grade silicon in accordance with another exemplary embodiment of the present invention is illustrated. Similar to the previous embodiment, the illustrated embodiment has a system 22 further divided into the first furnace zone 32, the second furnace zone 34, and the third furnace zone 36. The first, second, and third furnace zones 32, 34, 36 are mutually decoupled. The illustrated zones 32, 34, 36 have a horizontal orientation. In some embodiments, the orientation may be slightly tilted with respect to horizontal, so the gravity assists material in moving through the furnace zones. In some embodiments, the zones may include a combination of horizontal or near-horizontal and vertically oriented zones. All such permutations and combinations of zone orientations are envisaged. In certain other exemplary embodiments, the zones 32, 34, 36 may include rotary furnace zones. The syngas including hydrogen and carbon monoxide generated by heating the starting material and reacting the intermediate material in the furnace are fed to the power generation system 58 via a compressor 60 and a temporary storage unit 62 to generate electric power. The electric power is then fed to the thermal energy sources 38, 40, and 42. In the embodiments illustrated in FIGS. 3 and 4, transfer of material between the zones 32, 34, and 36 may be performed via connecting tubes.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method comprising:
heating a material comprising silica and a hydrocarbon material to form a starting material comprising silica and carbon;
reacting the starting material comprising silica and carbon to form an intermediate material comprising silica and silicon carbide;
reacting the intermediate material to form silicon;
collecting at least some of the emissions that are generated by forming the starting material and reacting the starting material or the intermediate material; and
using the collected emissions to generate electric power.

2. The method of claim 1 wherein at least one of heating the material comprising silica and a hydrocarbon material, reacting the starting material, and reacting the intermediate material, occurs in an electric furnace, and further comprising supplying the generated electric power to the electric furnace.

3. The method of claim 2 wherein the silica of the starting material comprises silica sand or silica gel.

4. The method of claim 3, comprising providing the starting material by decomposing the hydrocarbon material to deposit a coating on at least a portion of the silica sand or the silica gel.

5. The method of claim 4, wherein the hydrocarbon material comprises a gas or a liquid.

6. The method of claim 4, wherein the hydrocarbon material comprises alkanes, alkenes, alkynes, aromatic hydrocarbons, or any combinations thereof.

7. The method of claim 6, wherein the hydrocarbon material comprises natural gas, methane, butane, propane, acetylene, or any combinations thereof.

8. The method of claim 4, wherein decomposing the hydrocarbon material comprises heating the hydrocarbon material to a temperature greater than 600 degrees Celsius.

9. The method of claim 1, wherein reacting the starting material comprises heating the starting material to a temperature greater than 1600 degrees Celsius.

10. The method of claim 1, wherein reacting the intermediate material comprises heating the intermediate material to a temperature greater than 2000 degrees Celsius.

11. The method of claim 1, wherein reacting the intermediate material comprises reacting silica with silicon carbide to form the silicon.

12. The method of claim 1, wherein the intermediate material further comprises silicon oxycarbide.

13. The method of claim 1, wherein the collected emissions comprise hydrogen and carbon monoxide, and wherein using the collected emissions for generating the electric power comprises feeding the hydrogen and the carbon monoxide simultaneously to a power generation system for generating the electric power.

14. The method of claim 1, wherein the collected emissions comprise hydrogen and carbon monoxide, and wherein using the collected emissions for generating the electric power comprises feeding the hydrogen and the carbon monoxide separately to a power generation system for generating the electric power.

15. The method of claim 14, further comprising compressing and storing the hydrogen, the carbon monoxide, or combinations thereof temporarily in at least one gas storage unit.

16. The method of claim 1, wherein the collected emissions comprise hydrogen and carbon monoxide, and wherein using the collected emissions for generating the electric power further comprises burning and expanding the hydrogen, the carbon monoxide, or combinations thereof via a power generation system.

17. The method of claim 1, wherein at least a portion of the collected emissions and/or a combustion gas thereof are used to pre-heat at least a portion of the starting material prior to the reaction to form silicon.

\* \* \* \* \*